United States Patent [19]
Yan

[11] Patent Number: 5,136,179
[45] Date of Patent: Aug. 4, 1992

[54] LOGIC LEVEL DISCRIMINATOR

[75] Inventor: Raymond C. Yan, Daly City, Calif.

[73] Assignee: Teledyne Industries, Inc., Mountain View, Calif.

[21] Appl. No.: 561,286

[22] Filed: Aug. 1, 1990

Related U.S. Application Data

[63] Continuation of Ser. No. 264,631, Oct. 31, 1988, abandoned.

[51] Int. Cl.⁵ .............................................. H03K 5/12
[52] U.S. Cl. .................... 307/263; 307/296.5; 307/443; 307/446; 307/5770
[58] Field of Search ............... 307/279, 273, 290, 291, 307/296 R, 570, 446, 443, 475, 263, 464

[56] References Cited

U.S. PATENT DOCUMENTS

| | | | |
|---|---|---|---|
| 4,242,604 | 12/1980 | Smith | 307/290 |
| 4,268,764 | 5/1981 | Eckert | 307/290 |
| 4,295,062 | 10/1981 | Mihalich | 307/290 |
| 4,471,242 | 9/1984 | Noufer et al. | 307/475 |
| 4,490,633 | 12/1984 | Noufer et al. | 307/475 |
| 4,529,892 | 7/1985 | Reilly et al. | 307/290 |
| 4,558,234 | 12/1985 | Suzuki et al. | 307/446 |
| 4,581,545 | 4/1986 | Beale et al. | 307/290 |
| 4,612,457 | 9/1986 | Prater | 307/448 |
| 4,638,187 | 1/1987 | Boler et al. | 307/451 |
| 4,644,188 | 2/1987 | Grib | 307/354 |
| 4,656,374 | 4/1987 | Rapp | 307/475 |
| 4,687,953 | 8/1987 | Varadarajan | 307/443 |
| 4,694,201 | 9/1987 | Jason | 307/443 |
| 4,731,553 | 3/1988 | Van Lehn et al. | 307/579 |
| 4,749,882 | 6/1988 | Morgan | 307/579 |
| 4,763,022 | 8/1988 | Sheldon | 307/475 |
| 4,780,624 | 10/1988 | Nicollini et al. | 307/296 R |
| 4,785,203 | 11/1988 | Nakamura | 307/443 |
| 4,794,283 | 12/1988 | Allen et al. | 307/360 |
| 4,820,942 | 4/1989 | Chan | 307/443 |
| 4,829,199 | 5/1989 | Prater | 307/443 |
| 4,855,623 | 8/1989 | Flaherty | 307/491 |
| 4,857,770 | 8/1989 | Partovi et al. | 307/296.1 |

*Primary Examiner*—Stanley D. Miller
*Assistant Examiner*—Terry D. Cunningham
*Attorney, Agent, or Firm*—Fliesler, Dubb, Meyer & Lovejoy

[57] ABSTRACT

In an input buffer, logic level discrimination is provided by a first circuit which provides a first current to the output so that the output voltage is a hysteresis function of the input volt. To improve transient response without increasing power consumption, a second circuit is used to provide a second current to the output in support of the first current during transient periods of the input signal.

27 Claims, 3 Drawing Sheets

FIG.—3

LOGIC LEVEL DISCRIMINATOR

This application is a continuation of Ser. No. 264,631, filed Oct. 31, 1988, now abandoned.

TECHNICAL FIELD

The present invention generally relates to an input buffer and specifically to a buffer with capability to discriminate between logic levels of input signals. More specifically, the present invention relates to a complementary metal oxide semiconductor (CMOS) buffer circuit which discriminates between the logic levels of transistor-transistor-logic (TTL) digital signals.

BACKGROUND OF THE INVENTION

The logic states of digital signals are typically discriminated by circuits that operate to provide an output signal which follows a hysteresis function of an input signal. For example, in digital TTL circuits, a logic signal is considered "high" only when its voltage level is above a threshold (for example, 2 volt). However, to return to a "low" logic level, the voltage of the signal would have to drop below another threshold (for example, 0.8 volt). The separation between the two thresholds is used to prevent unexpected level switching due to noise.

The growing use of CMOS technology in digital circuits has led to an increasing demand for efficient CMOS logic level discriminators. One such discriminator is disclosed in U.S. Pat. No. 4,656,374, issued to A. K. Rapp on Apr. 7, 1987.

The principle focus of the Rapp patent is to reduce power dissipation by the discriminator. However, low power dissipation is not the only criterion by which a circuit is evaluated. With the increasing demand for high frequency signal switching, it becomes desirable to have a level discriminator circuit that has fast response time. Therefore, an object of the present invention is to provide a high speed CMOS logic level discriminator circuit. However, it is a related object of this invention to provide fast logic level discriminator circuit which has low power dissipation.

SUMMARY OF THE INVENTION

In accordance with the present invention, there is provided a level discriminator circuit which comprises means for providing a first current to generate an output voltage as a hysteresis function of the voltage level of an input signal. To improve level switching, however, the circuit also has a means for providing a second current to the output in support of said first current during a level transition of the input signal.

DETAILED DESCRIPTION OF THE PREFERRED EMBODIMENT

Figure 1:
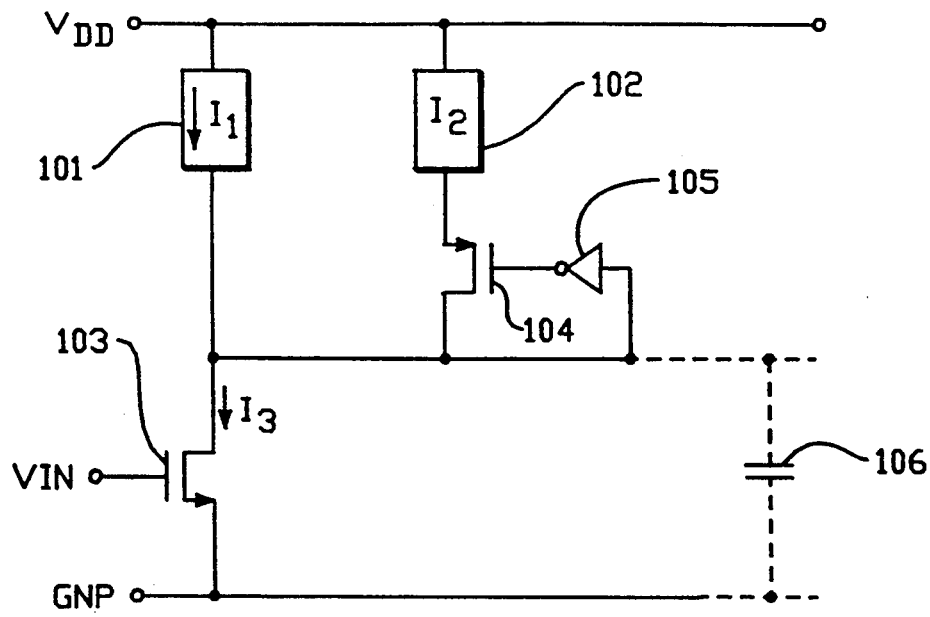
FIG. 1 is a schematic circuit diagram illustrating a prior art circuit whereby an output signal is provided as a hysteresis function of an input signal.

FIG. 1 is a prior art hysteresis circuit 100 in which an output signal $V_{out}$ connected to a capacitive load 106 is provided as a hysteresis function of an input signal $V_{in}$. Circuit 100 comprises a first current generator 101 which provides a charge current $I_1$ to load 106. Another charge current $I_2$ is provided load 106 by a second current generators 102. Charge current $I_2$, however, is controlled by the output voltage $V_{out}$ through an invertor 105 and a P-channel field effect transistor (FET) switch 104. N-channel FET 103 operates, in response to the input voltage $V_{in}$, to discharge a current $I_3$ from load 106.

The instantaneous value of the output voltage $V_{out}$ is a function of electrical charge accumulated in the capacitive load 106. Electrical charge accumulation in load 106 is the net result of electrical charge deposited by charge currents $I_1$ and $I_2$, minus the electrical charge depleted by discharge current $I_3$.

Because of invertor 105, the input to the gate of FET 104 will be low when $V_{out}$ is high. As a result, FET 104 will conduct when $V_{out}$ is high to allow the current $I_2$ to charge load 106. Conversely, when $V_{out}$ is low, the input to the gate of FET 104 will be high and current $I_2$ will be blocked from load 106.

The current $I_3$ conducted by FET 103 is a function of the input signal $V_{in}$. When $V_{in}$ is low enough so that $I_3$ is less than $I_1$, $V_{out}$, which is a function of the charge accumulated in load 106, will rise. Accordingly, the voltage at the gate of the FET 104 will fall. If the voltage at the gate of FET 104 falls to such a value that the source-to-gate voltage of the FET 104 is greater than the threshold voltage $V_T$, FET 104 will conduct current $I_2$ to charge load 106.

Switching $V_{out}$ from a high level to a low level is accomplished by discharging the capacitive load 106. This is achieved by raising $V_{in}$ so that discharge current $I_3$ is greater than the sum of $I_1$ and $I_2$. That is $$I_3 > I_1 + I_2$$

Since $I_3 = V_{in} * gm$, where gm is the transconductance of FET 103, the value $V_{in1}$ of $V_{in}$ for making $I_3$ greater than the sum of $I_1$ and $I_2$ is:

$$V_{in1} > \frac{I_1}{gm} + \frac{I_2}{gm}$$

As the capacitive load 106 is discharged, $V_{out}$ will fall and the voltage at the gate of the FET 104 will rise. When the voltage at the gate of FET 104 rises to such a level that the source-to-gate voltage of the FET 104 becomes less than the threshold voltage $V_T$, FET 104 will disconnect $I_2$ from load 106.

Switching $V_{out}$ from a low level to a high level is accomplished by recharging the capacitive load 106. Since $I_2$ is disconnected from load 106 when $V_{out}$ is low, capacitive load 106 will be recharged when the discharging current $I_3$ of FET 103 is smaller than the charging current $I_1$. The value $V_{in2}$ of $V_{in}$ for making $I_3$ smaller than $I_1$ is:

$$V_{in2} < \frac{I_1}{gm}$$

Figure 2:
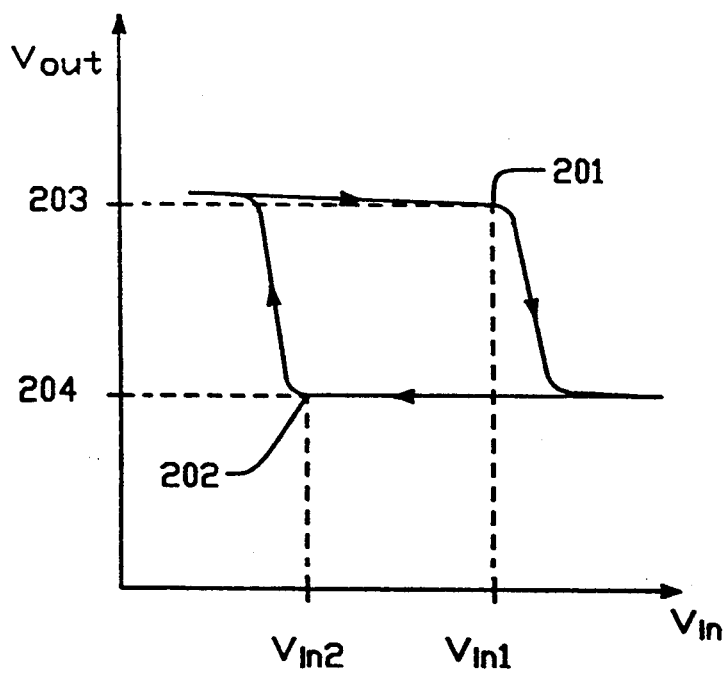
FIG. 2 shows a hysteresis relationship between $V_{in}$ and $V_{out}$ of the circuit of FIG. 1.

FIG. 2 shows a transfer characteristic of circuit 100. The figure shows that when $V_{in}$ exceeds a value of $V_{in1} > (I_1/gm + I_2/gm)$, $V_{out}$ will change from a first state 203 to a second state 204. However, only when $V_{in}$ falls below a value of $V_{in2} < I_1/gm$ will $V_{out}$ return from the second state 204 to the first state 203. The hysteresis of $V_{in2}-V_{in1}$ is dependent upon the value of $I_2$.

In circuit 100, the relationship between the current to the capacitive load 106 and the charge accumulated therein is:

$$I = C\left(\frac{dV_{out}}{dt}\right),$$

where C = capacitance of load 106.

Therefore, the rise time $t_{rise}$ of $V_{out}$ when $V_{in}$ goes from a high level to a low level is:

$$t_{rise} = \left(\frac{C}{I_{charge}}\right)\Delta V$$

For a given capacitance C of load 106, a faster rise time $t_{rise}$ can be achieved by using a larger $I_1$. But this will increase the power dissipation of the circuit 100 because $I_1$ is constantly drained by FET 103 when $V_{in}$ is high.

Figure 3:
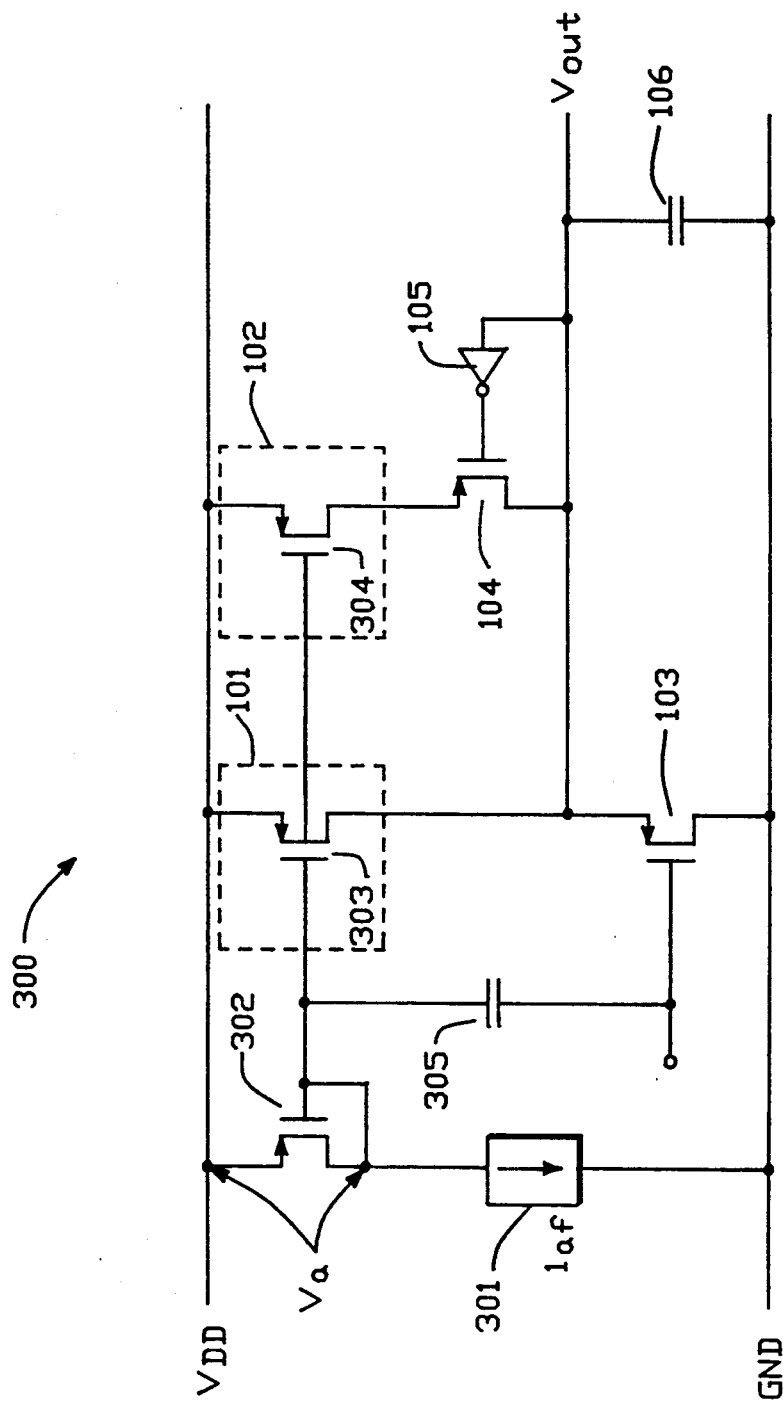
FIG. 3 is a schematic circuit diagram illustrating a prior art logic level discriminator circuit with improved transient response.

FIG. 3 illustrates another prior art hysteresis logic level discriminator circuit 300 in which the response time of $V_{out}$ is improved. Circuit 300 has a current generator 301 driving a current $I_{ref}$ through a P-channel FET 302. FET 302 is connected to P-channel FETs 303, 304 in a conventional current mirror configuration. The current mirror configuration between FETs 302 and 303 operates to mirror a current of $nI_{ref}$ from FET 302 to FET 303. The current mirror configuration between FETs 302 and 304 operates to mirror a current of $mI_{ref}$ from FET 302 to FET 304. As a result, FETs 303, 304 effectively operate respectively as the current sources 101, 102 of circuit 100, with $I_1 = nI_{ref}$ and $I_2 = -mI_{ref}$. The values of m and n depend upon the respectively width-to-length ratios of FETs 303 and 304 relative to that of FET 302.

The gates of FETs 302, 303 and 304 are coupled to the input signal $V_{in}$ by a capacitor 305. When $V_{in}$ is at steady state, the voltage at the gates of FETs 302, 303 and 304 will be stabilized at a value $V_a$ which is equal to the source-drain-voltage of transistor 302. The value of $V_a$ is determined by the value of $I_{ref}$ and the drawn width-to-length ratio of transistor 302.

When $V_{in}$ changes by $\Delta V_{in}$ from a high voltage level to a low voltage level (for example from 5 volts to 0 volts), capacitor 305 will pull the voltage at the gates of FETs 303 and 304 down by a value of $\Delta V_{in}$. As a result, the current charging load 106 during the transient period will become:

$$I_{charge} = \left(\frac{\mu C_o}{2}\right)\left(\frac{W}{L}\right)_{303}[(V_a + \Delta V_{in}) - V_{T(303)}]^2$$

When $V_{in}$ changes by $\Delta V_{in}$ from a low voltage level to a high voltage level (for example, for 0 volt to 5 volt) the voltage at the gates of FETs 303 and 304 will be pushed up $\Delta V_{in}$ by the capacitor 305. As a result, both FETs 303 and 304 will be shut off. The current discharging the capacitive load 106 will become:

$$I_{discharge} = \left(\frac{\mu C_o}{2}\right)\left(\frac{W}{L}\right)_{303}[\Delta V_{in} - V_{T(103)}]^2$$

Thus, by coupling the current sources to $V_{in}$ with capacitor 305, circuit 300 effectively operates as a class AB amplifier during the transient period. The response time of $V_{out}$ is thereby improved.

To reduce the response time, the charging current generated by FET 303 to load 106 can be increased by increasing the value of $V_a$. However, when $V_{in}$ is at high steady state, transistor 103 conducts and the current generated by FET 303 will dissipate through FET 103. Therefore, a disadvantage of circuit 300 is the high power dissipation caused by the steady state current passing through transistor 103.

Figure 4:
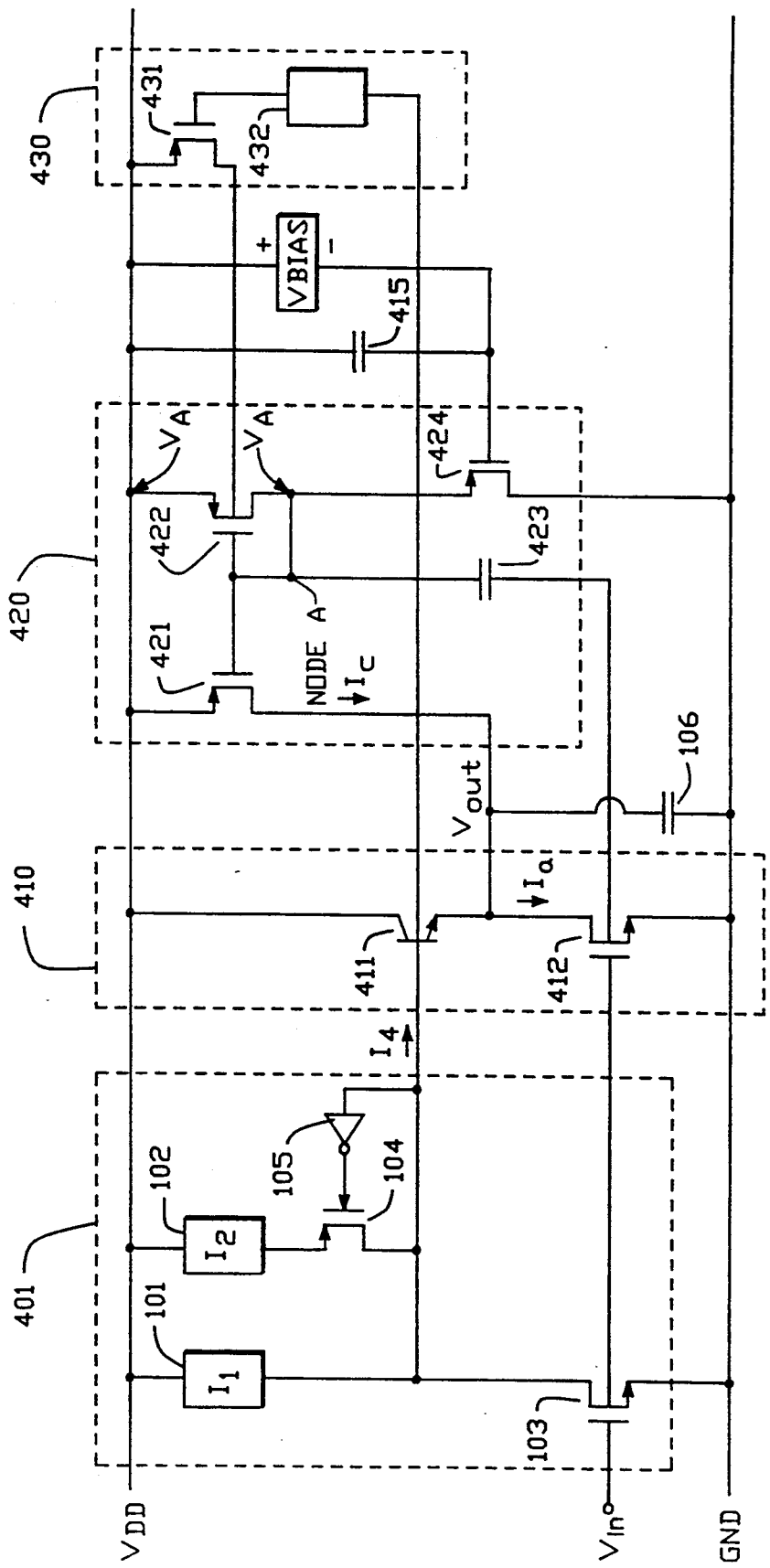
FIG. 4 is a schematic circuit diagram illustrating a preferred embodiment of the present invention.

FIG. 4 illustrates a circuit 400 wherein the present invention is embodied. The circuit 400 comprises a hysteresis circuit 401 which provides a current $I_4$ to establish a hysteresis function between $V_{out}$ and $V_{in}$ as circuit 100. However, in accordance with the present invention, the currents $I_1$ and $I_2$ in circuit 401 are kept small to reduce power dissipation even though fast response time is still achieved.

Circuit 400 includes block 420 which provides a current $I_5$ to the load 106 in support of $I_4$ during level transition of the input signal $V_{in}$.

Block 420 comprises two P-channel FETs 421, 422 connected as a current generator through current mirror operation. Specifically, the respective sources of FETs 421 and 422 are connected in common to the power supply terminal $V_{DD}$. The respective gates of FETs 421 and 422 are connected to the drain of FET 422. Because of the current mirror operation, a current $I_{422}$ flowing through FET 422 will cause a proportional current $I_5 pI_{422}$ to flow through FET 421. The value of p depends upon the drawn length-to-width ratio of transistor 421 relative to that of transistor 422.

The diode-connected FET 422 is biased by a P-type FET 424. The gate of FET 424 is biased at a voltage $V_{bias}$ so that the source-to-gate voltage of FET 421 and 422 at steady state is less than a threshold voltage $V_T$. As a result, FETs 421 and 422 will be cut off at steady state.

An output buffer 410 isolates load 106 from the hysteresis circuit 401. Buffer 410 comprises an NPN bipolar junction transistor 411 whose emitter is connected to the drain of a N-type FET 412 having a gate connected to receive the input signal $V_{in}$.

Bipolar transistor 411 operates as a source follower and is used for reducing the output current from the hysteresis circuit 401. It also maintains $V_{out}$ high when FETs 412 and 421 are cut off. When FET 412 is biased into its active region, it drains a large current $I_a$. But the current flowing out of the hysteresis circuit 401 is only $I_a/\beta_{411}$, where $\beta$ is the current gain of the bipolar transistor 411.

Transistor 411 can be replaced by an N-channel FET although the capacitance of the well and the source of an N-channel field effect transistor may be too large that such replacement is generally not practical.

The gate of FET 421 is coupled to the input signal $V_{in}$ by a capacitor 423 whose capacitance is greater than the parasitic capacitance at the gates of FETs 421 and 422.

When $V_{in}$ changes by a value of $\Delta V_{in}$ from a high voltage level to a low voltage level, FET 412 will be cut off. Moreover, capacitor 423 will pull down the voltage at the gates of FETs 421, 422 by $\Delta V_{in}$ to turn on FETs 421 and 422. Consequently, FET 421 will supply a charging current $$I_5 = I_{charge} = \left(\frac{\mu C_o}{2}\right)\left(\frac{W}{L}\right)_{421} [|\Delta V_{in}| - V_t]^2$$

to load 106. Thus, while load 106 receives a charge current $I_{charge}$ from pull up FET 421, no current is lost in the pull down FET 412 because FET 412 is cut off. Because there is no static current drain from $V_{DD}$ to ground, the rise time can be therefore made fast by increasing the channel width-to-length ratio of transistor 421 to increase $I_{charge}$.

After the transient, gates of FETs 421 and 422 will be charged back to its steady state value ($V_T/2$) by a current passing through the channel of FET 422. When the voltage at the respective gates of FETs 421 and 422 is recharged, FET 421 will be cut off and $I_5$ will be zero.

When $V_{in}$ is at low voltage level steady state, FET 103 will be cut off and the base of bipolar transistor 411 will be high. Thus, even though both FETs 412 and 421 are cut off at low steady state, $V_{out}$ is held high by the emitter of the bipolar transistor 411.

When $V_{in}$ changes by a value of $\Delta V_{in}$ from a low voltage level to a high voltage level, capacitor 423 will push the voltage at the gates of FETs 421, 422 to a value $\Delta V_{in}$ above $V_{DD}$. Since a voltage above $V_{DD}$ tends to cause latch up problem in CMOS technology, a p-channel FET 424 is added. The bias voltage $V_{bias}$ at the gate of FET 424 is set such that the gates of FETs 421, 422 are clamped at a voltage below $V_{DD}$ to prevent any possible latch up problem, but that the gates of FETs 421, 422 are clamped to a such voltage that any upward change of $V_{in}$ will still cut off FET 421. A capacitor 415 is coupled between the gate of FET 424 and $V_{DD}$ so that voltage fluctuations when circuit 400 operates at high frequency are eliminated.

$V_{in}$ changes from a low voltage level to a high voltage level, FET 412 will turn on and conduct a current of $$I_{discharge} = \frac{\mu C_o}{2}\left(\frac{W}{L}\right)_{412} [|\Delta V_{in}| - V_t]^2$$

to discharge load 106. At high steady state, FET 103 is turned on, thereby pulling the base of bipolar transistor 411 to the ground potential and cutting off transistor 411. FET 421 is normally held off by the bias voltage $V_{bias}$. Consequently, there is no current flowing from $V_{DD}$ to ground. Therefore, a faster discharge time of the output 106 can be released by increasing the width-to-length ratio of FET 412 to increase $I_{discharge}$ without increasing power dissipation of the circuit.

When $V_{in}$ reaches steady state, the gate of FET 421 will be restored to $V_A = V_T/2$. If the voltage at the gates of FETs 421 and 422 is lower than $V_A$, then it will be recharged by a current passing through the channel of FET 422. If the voltage at the gates of FETs 421 and 422 is higher than $V_A$, then it will be discharged through FET 424.

When the voltage at the gates of FETs 421 and 422 is pulled down by a value of $\Delta V_{in}$ due to a drop of $V_{in}$. The time for charging the gates of FETs 421 and 422 back to its steady state value is determined by $(C_{423})/(gm_{422})$. In a high speed circuit environment, the gates of FETs 421 and 422 may not have enough time to return to its steady state value, $V_T/2$. In this manner FET 421 will not cut off and will degrade the discharge time of load 106.

To further improve the response of the circuit 400, block 430 is coupled to the gates of FETs 421 and 422. Block 430 provides a one shot current to the gates of transistors 421 and 422 after a high to low transition of $V_{in}$. It comprises a one-shot logic circuit 432 which is activated by the signal $V_{out}$ at the output of circuit 401. In response to the one shot logic circuit 432, a current is passed from the power suppl $V_{DD}$ through transistor 431 to the gates of FETs 421 and 422 and pulls the voltage to the steady state value more quickly.

The following parameters are given as an example for implementing the embodiment:

$I_1 = 250 \mu A$ $I_2 = 250 \mu A$

Transistor 104 $\left(\frac{W}{L}\right)_P = 100/9$

Transistor 103 $\left(\frac{W}{L}\right)_N = 250/12$

Transistor 412 $\left(\frac{W}{L}\right)_N = 1000/9$

Transistor 421 $\left(\frac{W}{L}\right)_P = 900/8$

Transistor 422 $\left(\frac{W}{L}\right)_P = 10/7$

Transistor 424 $\left(\frac{W}{L}\right)_P = 225/8$

Capacitor 423 = 20 pf $V_{bias} = V_T$

With the above parameters,
$V_{in1}$ will be 1.9 Volt,
$V_{in2}$ will be 1.6 Volt, and
the hysteresis of the circuit will be:

1.9 − 1.6 = 300 mv

The foregoing disclosure and discussion of the present invention provide a broad teaching of the principles of the present invention such that many modifications and variations thereof will be readily apparent to persons of average skill in the art. One such modification is the substitution of PNP for NPN bipolar transistors, P-channel for N-channel transistors and N-channel for P-channel transistors with the corresponding changes in power source potentials. Therefore, it is understood that, within the scope of the appended claims, the invention may be practiced otherwise than as specifically described.

I claim:

1. A level discriminator circuit, comprising:
   hysteresis circuit means, responsive to an input signal, for selectively removing and supplying a first current to an output terminal to generate an output signal; and
   transient circuit means, responsive to said input signal, for selectively removing and supplying a short duration second current to the output terminal in support of said first current during a predetermined level transition of said input signal, said transient circuit means including
   a current generator means for supplying said short duration second current,
   biasing means coupled to said current generator for providing a steady state signal to disable said current generator means in the absence of a disturbing signal
   capacitive means, coupled to said current generator means and responsive to said input signal, for avoiding said disturbing signal to said biasing means in response to said predetermined level transition,
   a buffer connected between the hysteresis circuit means and the output terminal for current isolating said hysteresis circuit means from said output terminal, said buffer means including a bipolar transistor for current amplifying said first current.

2. A circuit as in claim 1, wherein said buffer means further comprises a transistor responsive to said input signal for removing current from the output terminal.

3. A circuit as in claim 2, wherein said current generator means comprises a current mirror configured pair of transistors including a current reference transistor coupled to a current following transistor.

4. A circuit as in claim 3, wherein said biasing means comprises a biasing transistor receiving a bias voltage, said biasing transistor being coupled in a current path of said current reference transistor of said current generator.

5. A circuit as in claim 4, further comprising a capacitor coupled between said biasing transistor and a fixed reference voltage to reduce voltage fluctuation of said bias voltage.

6. A circuit as in claim 4, wherein said current reference and current following transistors are field effect transistors of a first type, and wherein said biasing transistor is a field effect transistor of a second type.

7. A circuit as in claim 4, wherein said current reference and current following transistors are N-channel field effect transistors and wherein said biasing transistor is a P-channel field effect transistor.

8. A level discriminator circuit, comprising:
   hysteresis circuit means, responsive to an input signal, for selectively removing and supplying a first current to an output terminal to generate an output signal; and
   transient circuit means, responsive to said input signal, for selectively removing and supplying a short duration second current to said output terminal in support of said first current during a predetermined level transition of the input signal, said transient circuit means including
   a current generator means for supplying said host duration second current,
   biasing means, coupled to said current generator means and responsive to a disturbing signal, for providing a steady state signal to disable said current generator means, said biasing means also removing said steady state signal in response to said disturbing signal so as to enable said current generator mans, and
   capacitive means, coupled to said biasing means, for providing said disturbing signal, said transient circuit means further including means, coupled to said transient circuit means, for restoring said steady state signal after said predetermined level transition, said restoring means including a one-shot logic circuit.

9. A buffer for an input signal comprising:
   hysteresis circuit means for providing a first current as a hysteresis function of said input signal to an output terminal;
   buffer means, responsive to said first current, for isolating said hysteresis circuit means from said output terminal;
   current generator means for supplying a second current to said output terminal;
   biasing means, responsive to a disturbing signal and coupled to said current generator means, for providing a steady state signal to disable said current generator means in the absence of said disturbing signal; and
   capacitive means, responsive to said input signal and coupled to said current generator means, for providing said disturbing signal in response to a nonsteady state of said input signal.

10. A circuit as in claim 9, wherein said buffer means comprises a first transistor amplifying said first current and a second transistor responsive to said input signal for removing current from said output terminal.

11. A circuit as in claim 10, wherein said buffer means operates as a class AB circuit.

12. A circuit as in claim 10, wherein said current generator means comprises a driving transistor and a responding transistor connected in a current mirror configuration, said current generator means including a control terminal.

13. A circuit as in claim 12, wherein said biasing means comprises a biasing transistor coupled to said control terminal of said current generator.

14. A circuit as in claim 13, wherein said biasing transistor receives a bias voltage having a magnitude such that said current generator means is disable absent the provision of said disturbing signal.

15. A circuit as in 14, further comprising a capacitor coupled between a control terminal of said biasing transistor and a fixed reference voltage for removing voltage fluctuations of said bias voltage.

16. A circuit as in claim 15, wherein said driving and responding transistors are field effect transistors of a first type and wherein said biasing transistor is a field effect transistor of a complementary type.

17. A circuit as in claim 15, wherein said driving and responding transistors are N-channel field effect transistors and wherein said biasing transistor is a P-channel field effect transistor.

18. A circuit as in claim 9 or 15, further including means coupled between said hysteresis circuit and said current generator means for restoring said steady state signal after said predetermined level transition of said input signal.

19. A circuit as in claim 18, wherein said restoring means comprises a one-shot circuit.

20. Apparatus for improving the response time of a hysteresis circuit, the hysteresis circuit providing an output signal at an output terminal as a hysteresis function of an input signal received at an input terminal, the apparatus comprising:
   a buffer circuit, connected so as to isolate the hysteresis circuit from the output terminal, comprising a first transistor amplifying output current from the hysteresis circuit and a second transistor responsive to the input signal for drawing current from the output terminal;
   a current generator comprising a driving transistor and a responding transistor, the driving and responding transistors having respective control terminals for controlling respective current channels through the driving and responding transistors, the current channel of the driving transistor being provided between a voltage source and a control node, the current channel of the responding transistor being provided between the voltage source and the output terminal, wherein the control terminals are connected in common to the control node;
   bias means for biasing the control terminals of the current generator, including a biasing transistor receiving a biasing voltage at a biasing terminal and a first capacitor coupled between the voltage source and the biasing terminal for removing voltage fluctuations of the biasing voltage; and
   second capacitor coupling the control terminals of the current generator to the input signal.

21. A circuit as in claim 20, wherein the second capacitor removes a steady state signal present at the control terminals of the current generator in response to a predetermined level transition in the state of the input signal and wherein the bias means further includes means, coupled between the hysteresis circuit and the control terminals of the current generator, for restoring the steady state signal a predetermined period of time after said predetermined level transition.

22. A circuit as in claim 21, wherein the restoring means comprises a one-shot circuit.

23. A circuit for discriminating transitions between high and low logic levels, said circuit comprising:
   a) input means for providing an output signal, said input means implementing a hysteresis function relating said output signal to said input signal;
   b) buffer means for current buffering said output signal to provide a current buffered output signal at an output terminal, said buffer means including fast discharge means, responsive to said input signal, for sinking current from said output terminal; and
   c) source mans, including a current generator, for sourcing a transient surge of current from said current generator to said output terminal for the duration of a transient signal, said source means including means, responsive to said input signal, for producing said transient signal and means, responsive to said output signal, for limiting the duration of said transient signal.

24. The circuit of claim 23 wherein said source means includes biasing means for selecting the level of said transient signal that defines the duration of said transient signal with respect to said source means.

25. The circuit of claim 24 wherein said buffer means includes first and second transistors, said first transistor being coupled between a first voltage source and said output terminal, and said second transistor being coupled between said output terminal and a second voltage source, the conduction of current by said first and second transistors being responsive to said output and said input signals, respectively.

26. The circuit of claim 25 wherein said source means includes third and fourth transistors coupled as a current mirror at a control node, said current mirror providing for a first current path between said first voltage source and said output terminal and a second current path from said first voltage source, through said biasing means, to said second voltage source, said means for producing said transient signal including a capacitor through which said input signal is coupled to said control node.

27. The circuit of claim 26 wherein said limiting means includes a one-shot logic circuit for enabling a current path between said first voltage source and said control node.

* * * * *